(12) United States Patent
Wang

(10) Patent No.: US 9,000,753 B1
(45) Date of Patent: Apr. 7, 2015

(54) SMART METER VOLTAGE AND CURRENT SENSING USING OPTICALLY COUPLED ISOLATORS

(71) Applicant: International Technological University, San Jose, CA (US)

(72) Inventor: Karl L. Wang, Los Altos, CA (US)

(73) Assignee: International Technological University, San Jose, CA (US)

( * ) Notice: Subject to any disclaimer, the term of this patent is extended or adjusted under 35 U.S.C. 154(b) by 0 days.

(21) Appl. No.: 14/330,765

(22) Filed: Jul. 14, 2014

(51) Int. Cl.
*G01R 1/20* (2006.01)
*G01R 19/00* (2006.01)
*G01R 15/22* (2006.01)

(52) U.S. Cl.
CPC ...................................... *G01R 15/22* (2013.01)

(58) Field of Classification Search
CPC .. G01R 21/133; G01R 22/066; G01R 22/063; G01R 31/362; G01R 31/3648; G01R 21/127; G01R 22/10; G01R 19/252; G01R 21/1331; G01R 22/00; G01R 23/15; G01D 1/18; G02F 2001/133616; G02F 1/163; B03C 3/68
See application file for complete search history.

(56) References Cited

U.S. PATENT DOCUMENTS

| | | | |
|---|---|---|---|
| 7,768,424 B2 | 8/2010 | Harvey et al. | |
| 8,228,209 B2 | 7/2012 | Smith | |
| 8,234,017 B2 | 7/2012 | Ahn | |
| D668,983 S | 10/2012 | Manion et al. | |
| 8,466,803 B2 * | 6/2013 | Jonsson et al. | 340/870.02 |
| 8,509,109 B2 | 8/2013 | Guo et al. | |
| 8,587,290 B2 | 11/2013 | Pamulaparthy et al. | |
| 8,593,135 B2 * | 11/2013 | Chemel et al. | 324/142 |
| 8,654,711 B2 | 2/2014 | Guo et al. | |
| D701,784 S | 4/2014 | Manion et al. | |
| 8,750,100 B2 | 6/2014 | Guo et al. | |
| 2007/0016539 A1 | 1/2007 | Groft et al. | |
| 2008/0042873 A1 | 2/2008 | Harvey et al. | |
| 2009/0034418 A1 | 2/2009 | Flammer | |
| 2009/0198384 A1 | 8/2009 | Ahn | |
| 2010/0039263 A1 | 2/2010 | Chen et al. | |
| 2010/0131329 A1 | 5/2010 | An et al. | |
| 2010/0253538 A1 | 10/2010 | Smith | |
| 2011/0049984 A1 | 3/2011 | Son | |
| 2012/0026715 A1 | 2/2012 | Manion et al. | |
| 2012/0083937 A1 | 4/2012 | Kong | |
| 2012/0123709 A1 | 5/2012 | Chen et al. | |
| 2012/0124367 A1 | 5/2012 | Ota | |
| 2012/0131324 A1 | 5/2012 | Ansari et al. | |
| 2012/0137126 A1 | 5/2012 | Matsuoka et al. | |
| 2012/0200424 A1 | 8/2012 | Nishizawa et al. | |
| 2012/0249121 A1 | 10/2012 | Pamulaparthy et al. | |
| 2012/0280832 A1 | 11/2012 | Jonsson et al. | |
| 2012/0280833 A1 | 11/2012 | Jonsson et al. | |
| 2012/0287596 A1 | 11/2012 | Manion et al. | |
| 2012/0327792 A1 | 12/2012 | Guo et al. | |
| 2013/0015716 A1 | 1/2013 | Matsushima et al. | |
| 2013/0057367 A1 | 3/2013 | Smith | |
| 2013/0077610 A1 | 3/2013 | Amini et al. | |

(Continued)

*Primary Examiner* — Vinh Nguyen
(74) *Attorney, Agent, or Firm* — Sawyer Law Group, P.C.

(57) ABSTRACT

A transformer-less method and system for voltage and current sensing using voltage drops across resistors is disclosed. Using optically coupled isolators, the sensed voltages in the high voltage power lines are optically coupled and electrically isolated to the low voltage circuits. The circuit designs for voltage and current sensing's and electrical isolation are disclosed.

7 Claims, 7 Drawing Sheets

(56) References Cited

U.S. PATENT DOCUMENTS

| | | |
|---|---|---|
| 2013/0079938 A1 | 3/2013 | Lee et al. |
| 2013/0208583 A1 | 8/2013 | Guo et al. |
| 2013/0223334 A1 | 8/2013 | Guo et al. |
| 2013/0262844 A1 | 10/2013 | Hester |
| 2013/0300576 A1 | 11/2013 | Sinsuan et al. |
| 2014/0156093 A1 | 6/2014 | Brian et al. |
| 2014/0167979 A1 | 6/2014 | SOMA et al. |
| 2014/0277788 A1 | 9/2014 | Forbes, Jr. |

* cited by examiner

US 9,000,753 B1

SMART METER VOLTAGE AND CURRENT SENSING USING OPTICALLY COUPLED ISOLATORS

FIELD OF THE INVENTION

The present invention is related generally to meters for measuring power and more particularly to a smart meter system.

BACKGROUND

In smart meter system voltage and current sensing, electrical isolation between the high voltage and the low voltage domains is necessary. One common way to achieve that is to use voltage and current transformers. The average power dissipated in resistive loads, e.g. household appliances, can be calculated as the product of root-mean-squares of current and voltage averaged over a time period. But for non-resistive loads, such as AC motors, the average AC power can be calculated by the direct product of current and voltage averaged over a period of time. Since the voltage induced across a transformer is proportional to the rate of change of current, a direct measurement of the current cannot be easily done directly from the outputs of a current transform. On the other hand, a direct current sensing can be easily done by measuring the voltage drop across a small shut resistor connected in series with the power line. Another advantage of using resistors and optically coupled isolators is the fact that voltage and current sensing's cannot be tampered as in the case of transformers by placing a strong external magnets in the close proximity as to saturate the transformer cores. In addition, the transformer-less approach is the smaller size as compared with that of transformers to enable a compact form factor design. Furthermore, the cost of resistors and isolators are less as compared to that of the transformers.

There is a need to enhance system performance, reliability, testability and manufacturability of the smart meter during the product production and prototyping. Accordingly, what is needed is a system and method that addresses such needs. The system and method must be easily implemented, cost effective and adaptable to existing systems. The present invention addresses such a need.

SUMMARY

A transformer-less method and system for voltage and current sensing using voltage drops across resistors is disclosed. Using optically coupled isolators, the sensed voltages in the high voltage power lines are optically coupled and electrically isolated to the low voltage circuits. The circuit designs for voltage and current sensing's and electrical isolation are disclosed.

In a first aspect a method of sensing current within a smart meter is disclosed. The method includes coupling at least one resistor to a high voltage portion of the smart meter. The method also includes optically coupling the high voltage portion to a low voltage portion of the smart meter.

In a second aspect, a method of sensing voltage within a smart meter is disclosed. The method includes coupling a resistor voltage divider to a high voltage portion of the smart meter. The method also includes optically coupling the high voltage portion to a low voltage portion of the smart meter.

DETAILED DESCRIPTION

The present invention is related generally to meters for measuring power and more particularly to a smart meter system. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
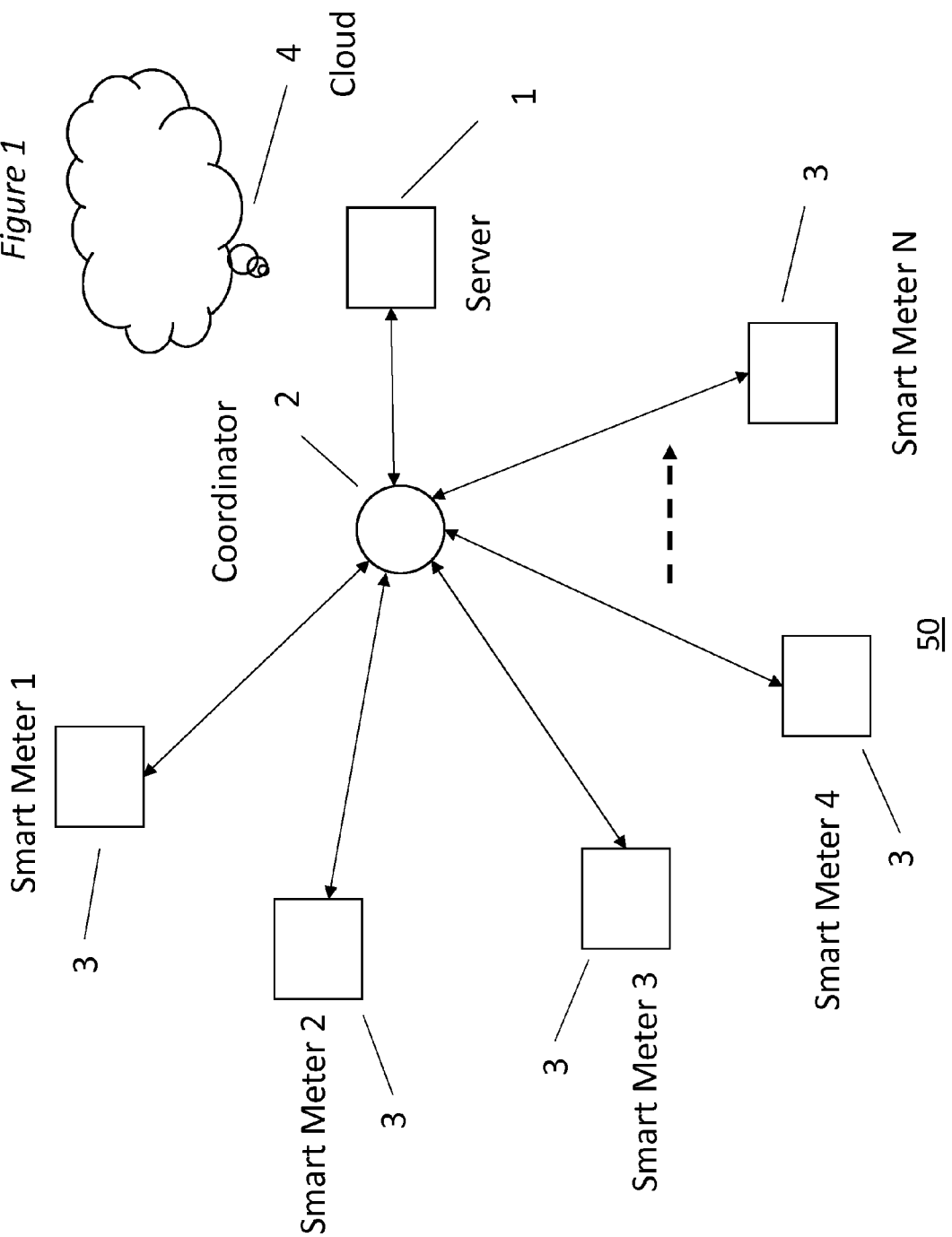
FIG. 1 is an illustration of smart meter system.

FIG. 1 is an illustration of the smart meter system 50 in accordance with an embodiment. The smart meter system 50 comprises a local server 1 connected to a coordinator 2 and smart meters 3 (smart meter 1-N). In one embodiment, the local server 1 is connected to the coordinator 2 via wires. In another embodiment, the local server 1 is connected to the coordinator 2 wirelessly.

The smart meter system 50 is a many-to-one data communication topology. In this embodiment, the local server 1 issues a command to the coordinator 2 which executes the command by sending a corresponding data packet wirelessly to the smart meters 3 by a radio frequency (RF) link, e.g. ZigBee that may or may not support an industry standard such as IEEE 802.14.5. Then the smart meters 3 send an appropriate response back to the coordinator 2 by the same RF link. Power usage data sent by the smart meters 3 can be stored in a database hosted in the local server 1 or an internet cloud 4.

The power usage can be accessed for example by displaying web pages using any device that is connected to the local server or the internet. The database can be analyzed to determine optimal power usage and distribution. The power usage can also be analyzed to enable system control, e.g. cut off the power if necessary.

The local server 1 issues commands to the coordinator 2 through a coordinator-server interface control register. The coordinator server interface control register typically resides within the coordinator 2 and allows for the communication between the local sever 1 and the coordinator 2. The coordinator server interface control register streamlines and enhances the performance of tasks between server 1 and coordinator 2.

Figure 2:
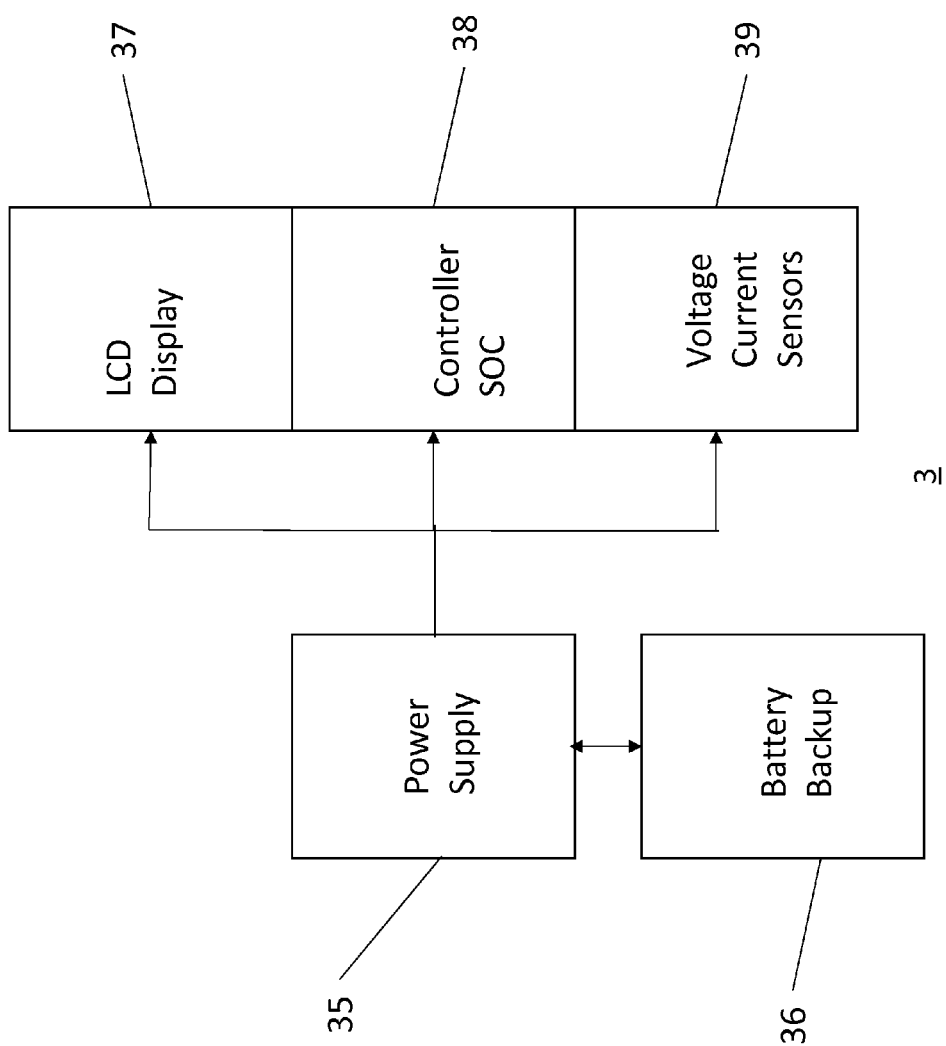
FIG. 2 is an illustration of a smart meter in accordance with an embodiment.

FIG. 2 is an illustration of a smart meter 3 in accordance with an embodiment. The smart meter 3 comprises a power supply 35, a battery backup 36, a liquid crystal display or LCD display 37, a RF controller System-on-Chip (SOC) 38, and voltage and current sensors 39. The battery backup 36 provides a non-interruptible power supply in the event of a power failure. The battery backup 36 enables the detection of power failure in the smart meter 3. The status of the battery backup 36 is reported in the STATUS register.

A key feature of the present invention is that there is no need for a transformer when sensing voltage and current. This is made possible by optically isolating a high voltage portion of the smart meter from a low voltage portion. In so doing, resistors can be utilized to provide the current or voltage sensing properties of the smart meter. By eliminating the transformer the smart meter can be physically smaller, less costly and will not be tampered as in the case when the transformer core is placed in a saturation condition. To describe the features of the present invention in more detail refer now to the following description in conjunction with the accompanying Figures.

Figure 3:
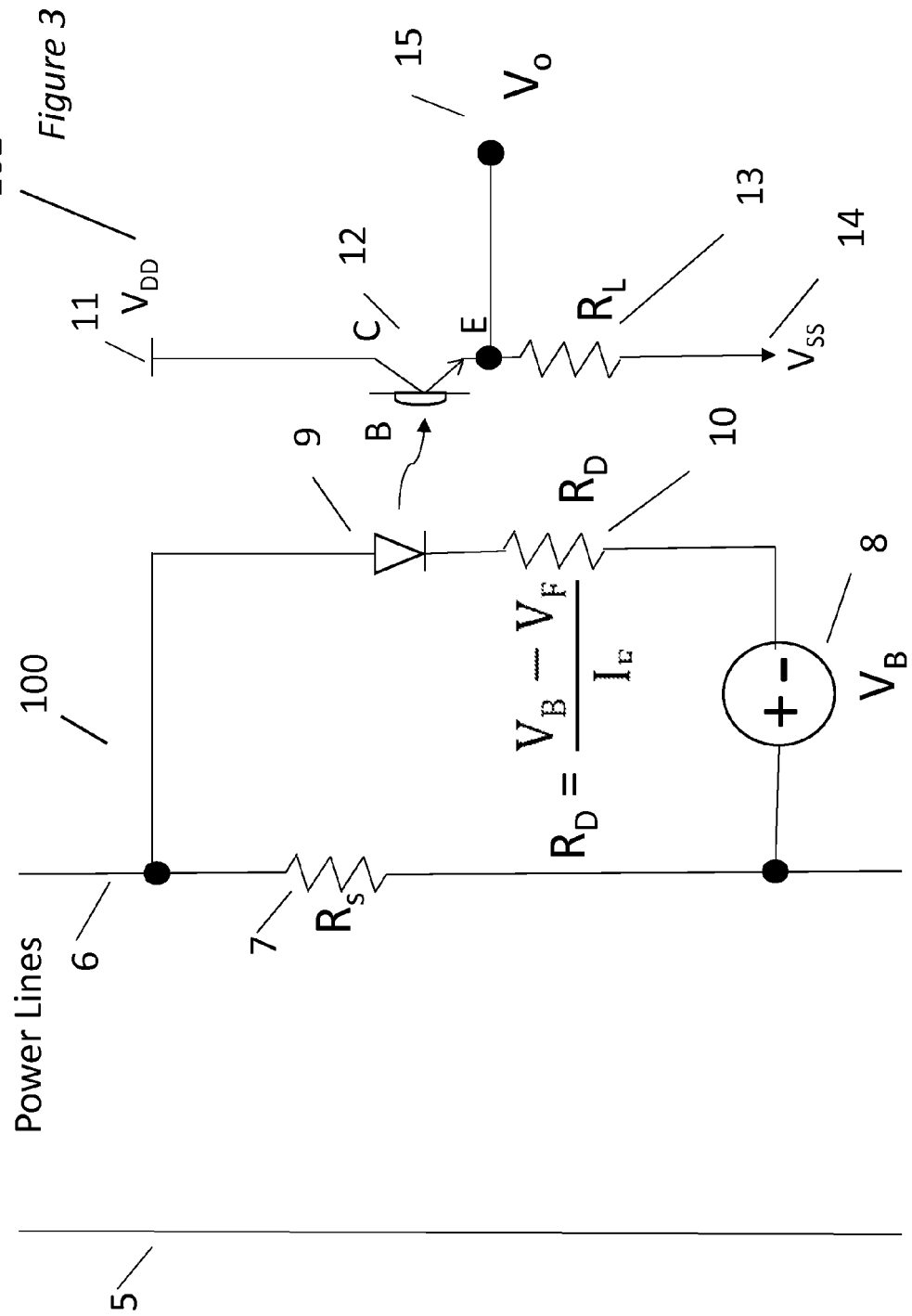
FIG. 3 is an illustration of circuit design for current sensing transistor in an open source configuration with load resistor connected to the emitter.

FIG. 3 is an illustration of circuit design for a current sensing portion of voltage and current sensors 39 in the smart meter 3 of FIG. 2 for a single-phase power line system. The first terminal of a small shunt resistor $R_S$ 7 is connected in series with the hot line of power line pair 6 which is a high voltage portion 100; the other power line 5 is the neutral or ground line. The cathode terminal of an infra-red (IR) LED 9 is connected to the first terminal of resistor $R_S$. The anode terminal of IR LED is connected with the first terminal of resistor $R_D$ 10. The second terminal of $R_D$ 10 is connected to the negative terminal of a voltage source $V_B$ 8. The positive terminal of $V_B$ is connected to the second terminal of $R_S$ 7.

An optical transistor 12 has a base terminal B that is optically coupled to the IF LED which is a low voltage portion 102. The collector terminal C is connected to the $V_{DD}$ terminal 11. The emitter terminal E is connected to the first terminal of a resistor $R_L$ 13 in an emitter follower configuration. The second terminal of $R_L$ 13 is connected to the $V_{SS}$ terminal 14. An output signal $V_O$ 15 is connected to the emitter terminal E of the optical transistor 12. The optically coupled isolator comprises of the IR LED 9 and the optical transistor 12.

The IF LED 9 is biased in the forward conduction region using a voltage source $V_B$ 8. This bias condition is determined by choosing a current-limiting resistor $R_D$ 10 that is equal to the difference of bias voltage source $V_B$ 8 and the forward voltage $V_F$ of the IR LED diode divided by the forward current IF of the IR LED diode. This bias condition enables the IR LED diode to operate at a voltage bias condition to maximize the sensitivity of the optically coupled isolator and minimize the current consumption.

Figure 4:
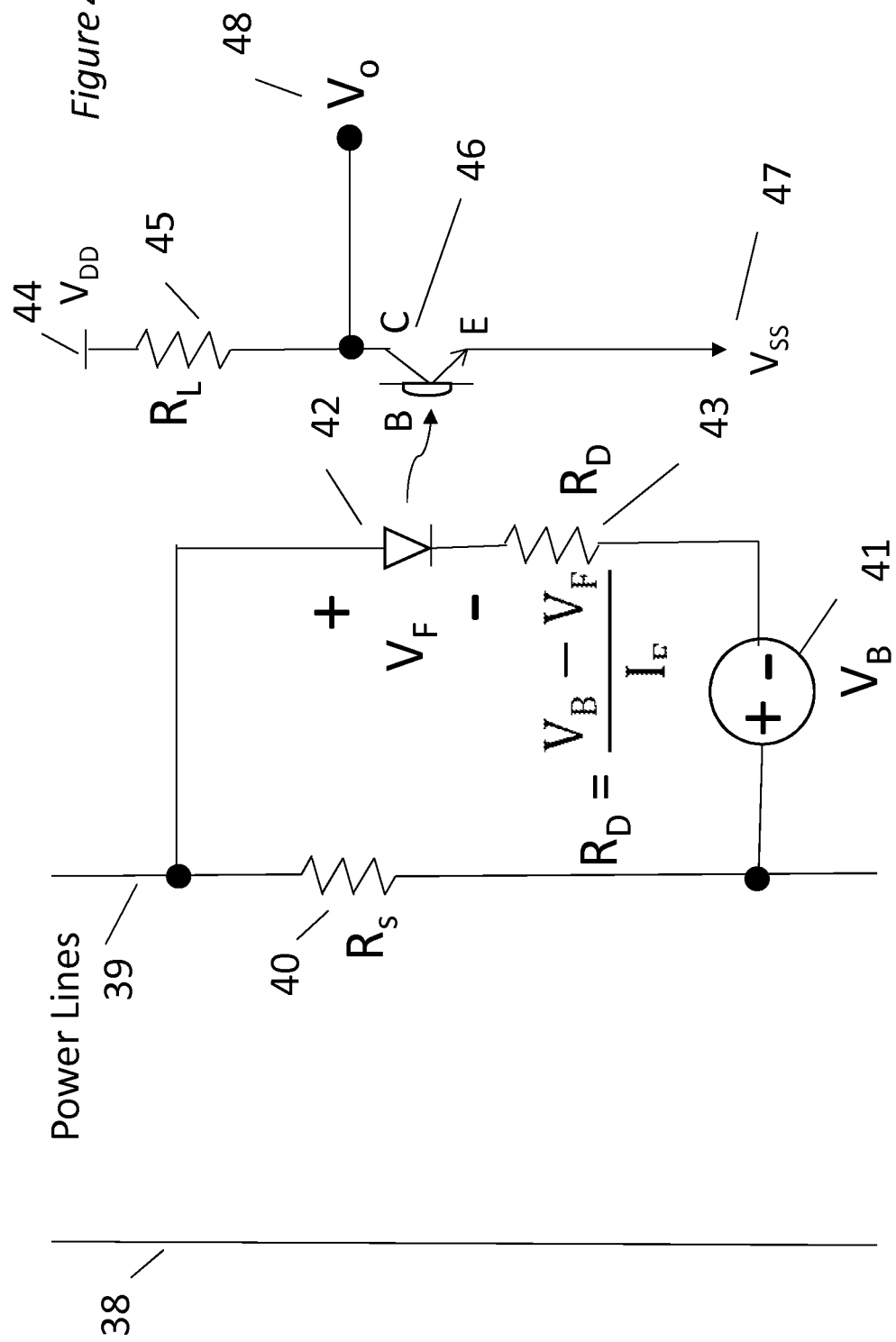
FIG. 4 is an illustration of the output transistor in the open drain configuration with a load resistor connected to the collector.

FIG. 4 is an illustration of the output transistor in the open drain configuration with a load resistor $R_L$ 45. The first terminal of $R_L$ 45 is connected to $V_{DD}$ and the second terminal of $R_L$ 45 is connected to the collector terminal C of the optical transistor 46. The output voltage $V_O$ 48 is taken from the collector terminal C of the optical transistor 46.

Figure 5:
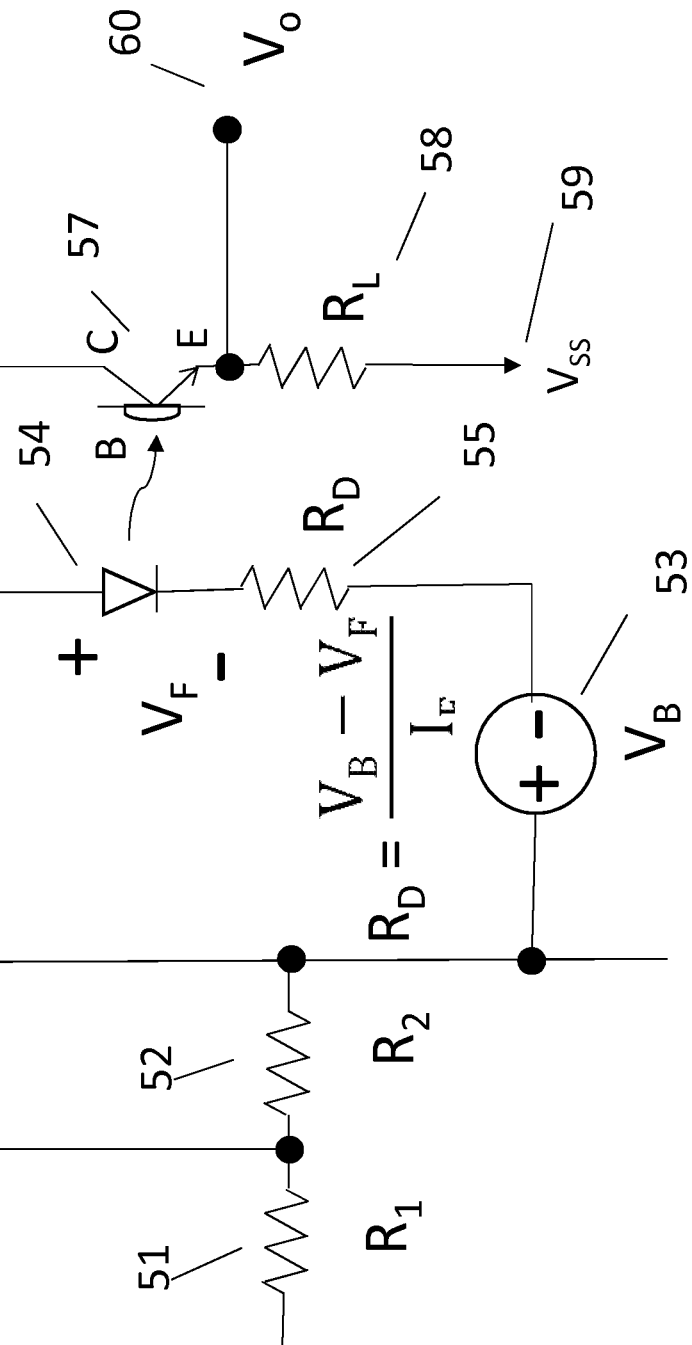
FIG. 5 is an illustration of circuit for voltage sensing transistor in an open source configuration with a load resistor connected to the emitter.

FIG. 5 is an illustration of circuit for voltage sensing transistor in the open source configuration with a load resistor $R_L$ 58. The voltage sensing circuit comprises of a voltage divider consisting of resistor $R_1$ 51 and $R_2$ 52 that are connected in series across the hot power lines 49 and the neutral power line 50 where the first terminal of $R_1$ 51 is connected to the hot power lines 49, the second terminal of $R_1$ 51 is connected to the first terminal of $R_2$ 52, and the second terminal of $R_2$ 52 is connected to the neutral power line 50. The first terminal of resistor $R_2$ 52 is connected to the cathode terminal of the IR LED 54. The anode terminal of IR LED 54 is connected to the first terminal of resistor $R_D$ 55. The second terminal of $R_D$ 55 is connected to the negative terminal of a voltage source $V_B$ 53. The positive terminal of $V_B$ 53 is connected to the second terminal of $R_2$ 52.

An optical transistor 57 has a base terminal B that is optically coupled to the IF LED. The collector terminal C is connected to the $V_{DD}$ terminal 56. The emitter terminal E is connected to the first terminal of a resistor $R_L$ 58 in the open emitter configuration. The second terminal of $R_L$ 58 is connected to the $V_{SS}$ terminal 59. The output voltage $V_O$ is taken from the emitter terminal E of the optical transistor 57.

Figure 6:
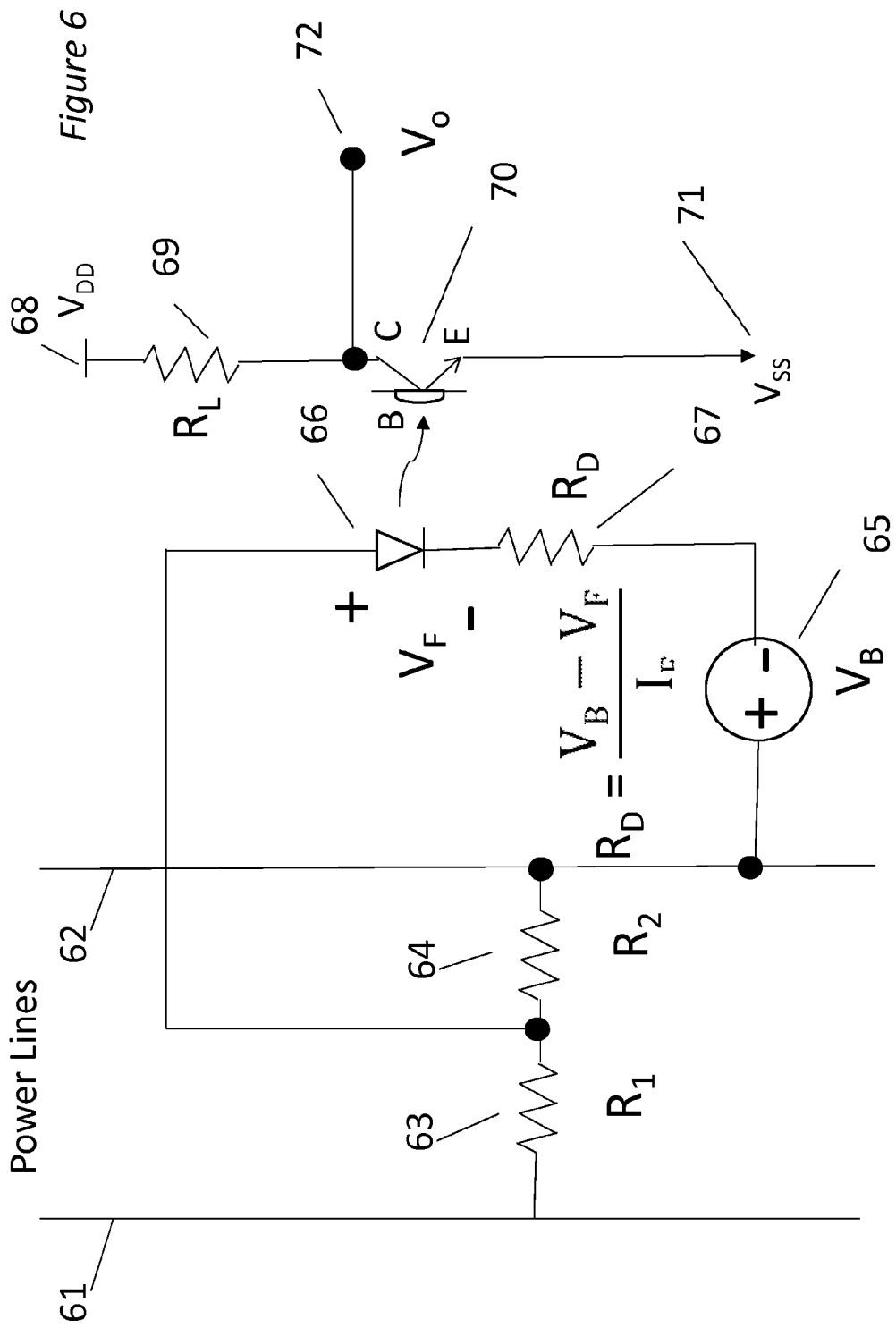
FIG. 6 is an illustration of circuit for voltage sensing transistor in an open drain configuration with a load resistor connected to the collector.

FIG. 6 is an illustration of circuit for voltage sensing transistor in the open drain configuration with a load resistor $R_L$ 69. An optical transistor 69 has a base terminal B that is optically coupled to the IF LED 66. The emitter terminal E is connected to the $V_{ss}$ terminal 71. The collector terminal C is connected to the second terminal of a resistor $R_L$ 69 in the open drain configuration. The first terminal of $R_L$ 69 is connected to the $V_{DD}$ terminal 68. The output voltage $V_O$ 72 is taken from the collector terminal C of the optical transistor 70.

Figure 7:
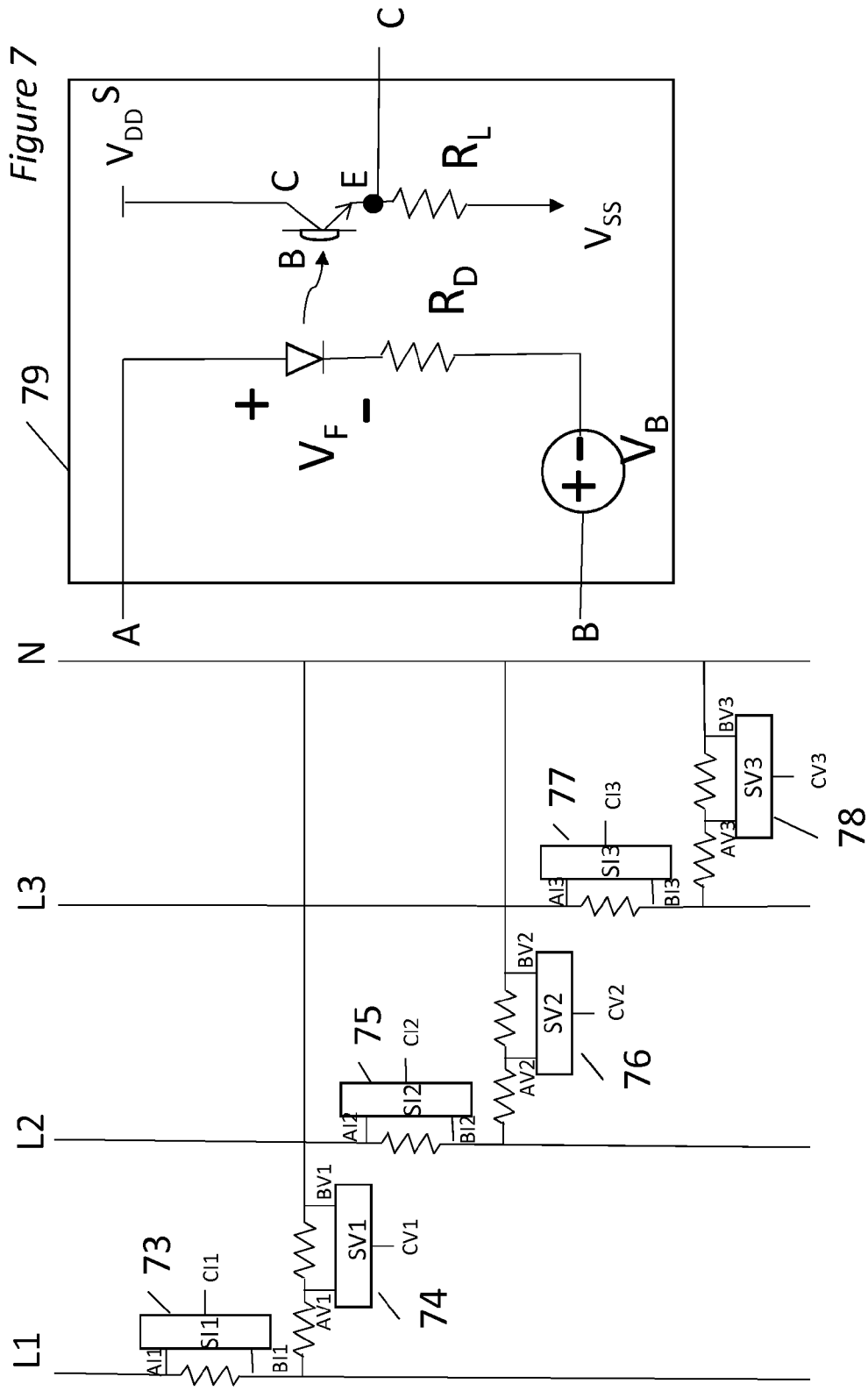
FIG. 7 is an illustration of circuit for voltage and current sensing for the open source configuration for a 3-phase power line application.

FIG. 7 is an illustration of circuit for voltage and current sensing for the open source configuration for a 3-phase power line application. The circuit SI1 73 senses the current of L1 phase; the circuit SV1 74, senses the voltage of L1 phase; the circuit SI2 75, senses the current of L2 phase; the circuit SV2 76, senses the voltage of L2 phase; the circuit SI3 77, senses the current of L3 phase; the circuit SV3 78, senses the voltage of L3 phase.

A smart meter system voltage and current sensing are performed as voltage drops across a shut resistor in series with the power line or from a voltage divider connected across the power lines. These voltages are optically coupled and electrically isolated to the inputs of the low voltage circuits by using optically coupled isolators. Circuits for the voltage and current sensing method are described using resistors and optically coupled isolators. The advantages of this transformer-less method as compared to the transformer approach are direct sensing of current and voltage that enables AC power and energy measurements for non-resistive loads, tamper proof for secure power measurements, compact sizes, and low costs.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A method of sensing current within a smart meter comprising:

coupling a first resistor to a high voltage portion of the smart meter; and optically coupling the high voltage portion to a low voltage portion; wherein the optical coupling is provided by an infrared (IR) emitting diode on the high voltage portion and an optical transistor on the low voltage portion; wherein the IR emitting diode and the optical transistor comprises a optically coupled isolator;

wherein a second resistor ($R_D$) coupled to the IR emitting diode provides a bias condition to the IR emitting diode; wherein the second resistor ($R_D$) is determined by the equation $$R_D = \frac{V_B - V_F}{I_F},$$

wherein $V_B$ is a bias voltage source, $V_F$ is a forward voltage of the IR emitting diode and $I_F$ is a forward current of the IR emitting diode; and wherein current is sensed based upon a voltage measured across the first resistor.

2. The method of claim 1, wherein the IR emitting diode is biased in a forward conduction region to maximize a change in current with respect to a change the applied forward voltage.

3. The method of claim 1, wherein the IR emitting diode operates at a forward conduction region of a current-voltage characteristic of the IR emitting diode with large gain to maximize sensitivity of the optically coupled isolator while minimizing current consumption.

4. The method of claim 1, wherein the optical transistor is in an emitter follower configuration.

5. The method of claim 4, wherein a load resistor is coupled to an emitter of the optical transistor to develop a voltage that is proportional and in phase to a sensed current.

6. The method of claim 1, whereas the optical transistor is in an open drain configuration.

7. The method of claim 6, wherein a load resistor is coupled to a collector of the optical transistor to develop a voltage that is proportional and in 180 degrees out of phase to a sensed current.

* * * * *